(12) United States Patent
Smith et al.

(10) Patent No.: US 10,157,897 B1
(45) Date of Patent: Dec. 18, 2018

(54) HYBRID LED AND COLOR CONVERSION FILM DISPLAYS

(71) Applicant: Intel Corporation, Santa Clara, CA (US)

(72) Inventors: Marshall Smith, Santa Clara, CA (US); Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/860,572

(22) Filed: Jan. 2, 2018

(51) Int. Cl.
| | |
|---|---|
| H01L 33/50 | (2010.01) |
| H01L 25/075 | (2006.01) |
| H01L 33/62 | (2010.01) |
| H01L 33/42 | (2010.01) |
| H01L 33/32 | (2010.01) |
| H01L 33/08 | (2010.01) |
| H01L 33/24 | (2010.01) |
| H01L 33/06 | (2010.01) |
| H01L 33/00 | (2010.01) |
| H01L 27/12 | (2006.01) |
| C09K 11/70 | (2006.01) |
| H01L 27/32 | (2006.01) |

(52) U.S. Cl.
CPC ...... *H01L 25/0753* (2013.01); *H01L 27/1214* (2013.01); *H01L 33/007* (2013.01); *H01L 33/0079* (2013.01); *H01L 33/06* (2013.01); *H01L 33/08* (2013.01); *H01L 33/24* (2013.01); *H01L 33/32* (2013.01); *H01L 33/42* (2013.01); *H01L 33/502* (2013.01); *H01L 33/62* (2013.01); *C09K 11/703* (2013.01); *H01L 27/322* (2013.01); *H01L 33/508* (2013.01); *H01L 2933/0016* (2013.01); *H01L 2933/0066* (2013.01); *H01L 2933/0083* (2013.01)

(58) Field of Classification Search
CPC ............................ H01L 27/322; H01L 33/508
USPC ............................................... 257/90; 438/35
See application file for complete search history.

(56) References Cited

U.S. PATENT DOCUMENTS

| | | | |
|---|---|---|---|
| 2007/0120477 A1* | 5/2007 | Nakua .................. | H01L 27/322 313/506 |
| 2015/0349034 A1* | 12/2015 | Hack .................. | H01L 27/3218 257/40 |

(Continued)

OTHER PUBLICATIONS

Bulashevich et al.; "Simulation of light-emitting diodes for new physics understanding and device design"; In: Light-Emitting Diodes: Materials, Devices and Applications for Solid-State Lighting XVI; Edited by Streubel et al.; Proceedings of SPIE 2012; 12 pages; vol. 8278; (Invited Paper) [8278-43]; The International Society of Optical Engineering; San Francisco, California, United States.

(Continued)

*Primary Examiner* — George Fourson, III
(74) *Attorney, Agent, or Firm* — Thorpe North and Western, LLP; David W. Osborne

(57) ABSTRACT

A display component can include an array of pixels and a color conversion film. Each pixel in the array can include one or more green sub-pixel emitters and a plurality of blue sub-pixel emitters. The color conversion film can be disposed on a subset of the plurality of blue sub-pixel emitters. The color conversion film can be configured to convert blue light from the subset of the plurality of blue sub-pixel emitters to red light to realize a pixel including red, green and blue emitters.

28 Claims, 5 Drawing Sheets

(56) References Cited

U.S. PATENT DOCUMENTS

| | | | |
|---|---|---|---|
| 2016/0133675 A1* | 5/2016 | Yata | H01L 27/3218 |
| | | | 257/89 |
| 2016/0358981 A1* | 12/2016 | Bai | H01L 27/3213 |
| 2017/0069290 A1* | 3/2017 | Lee | G09G 3/2003 |
| 2017/0162829 A1* | 6/2017 | Lai | H01L 27/322 |
| 2018/0088404 A1* | 3/2018 | Chae | G02F 1/133512 |
| 2018/0108303 A1* | 4/2018 | Park | G02F 1/23 |
| 2018/0114775 A1* | 4/2018 | Ray | H01L 25/0655 |

OTHER PUBLICATIONS

Proceedings of SPIE; "Front Matter: vol. 8278"; Proceedings of SPIE 8278; Light-Emitting Diodes: Materials, Devices, and Applications for Solid State Lighting XVI; (Feb. 17, 2012); 9 pages; vol. 827801; Society of Photo-Optical Instrumentation Engineers; <doi: 10.1117/12.927873 >.

* cited by examiner

HYBRID LED AND COLOR CONVERSION FILM DISPLAYS

BACKGROUND

Displays based on inorganic micro Light Emitting Diodes (μLEDs) have attracted increasing attention for applications in emerging portable electronics and wearable computers, such as Head-Mounted Displays (HMDs), wristwatches, tablet Personal Computers (PCs), notebook PCs, and other similar devices. However, it has been challenging to obtain high-efficiency red, green and blue μLEDs using the same technologies and materials. Although it may be possible to achieve high-efficiency red, green and blue μLEDs using different technologies and materials, the manufacturing complexity of the displays increases. Therefore, there is a continuing need for improved technologies and materials to produce high-efficiency red, green and blue emitters, while also reducing manufacturing complexity of the display components.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

DESCRIPTION OF EMBODIMENTS

Figure 1:
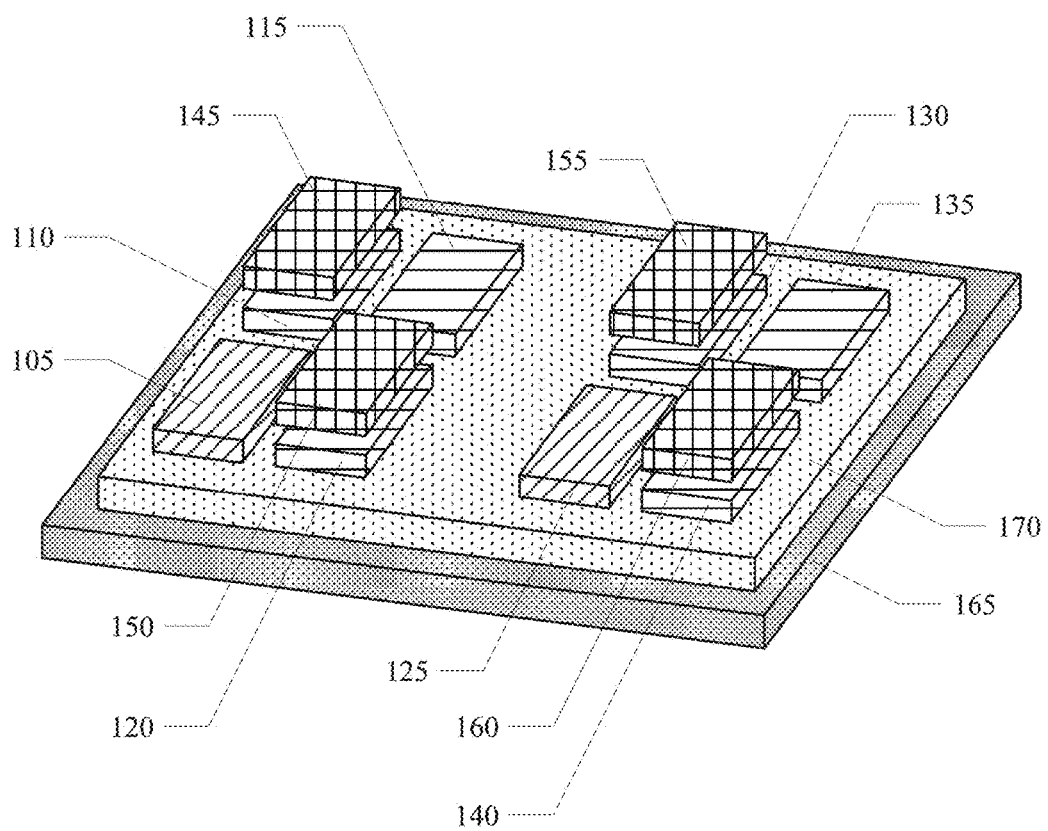
FIG. 1 is a diagram illustrating a display component, in accordance with an example embodiment.

Before invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a" includes a plurality of such.

Reference throughout this specification to "an example" means that a particular feature, structure, or characteristic described in connection with the example is included in at least one invention embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as central processing units (CPUs), graphics processing units (GPUs), digital signal processors (DSPs), microcontrollers (MCUs), embedded controller (ECs), field programmable gate arrays (FPGAs), or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

In one aspect, a display device can include a backplane, an array of pixels, a color conversion film and a transparent cathode. The backplane can include a select drive circuit including an array of anodes. The array of pixels can include one or more green sub-pixel emitters and a plurality of blue sub-pixel emitters coupled to respective ones of a plurality of the anodes of the backplane. The color conversion film can be disposed on a subset of the plurality of blue sub-pixel emitters. The color conversion film can be configured to convert blue light from the subset of the plurality of blue sub-pixel emitters to red light. The transparent cathode can be disposed over the one or more green sub-pixel emitters and the plurality of blue sub-pixel emitters, and disposed under the color conversion film.

In one aspect, the manufacture of the display device can include monolithically forming one or more green sub-pixel emitters and a plurality of blue sub-pixel emitters of a pixel on a substrate. The pixels can be transferred from the substrate to a backplane including a select drive circuit. In transferring the pixels to the substrate, anodes of the one or more green sub-pixel light source and anodes of the plurality of blue sub-pixel emitters are electrically coupled to respective anode contacts of the select drive circuit. A transparent cathode can be disposed over the pixels on the backplane. A color conversion film can be disposed over a subset of the plurality of blue sub-pixel emitters to realize pixels including red, green and blue emitters.

FIG. 1 is a diagram illustrating a display component, in accordance with an example. In one aspect, the display component 100 can include an array of pixels 105-140 and a color conversion film 145-160. Each pixel 105-120 can include one or more green sub-pixel emitters 105, and a plurality of blue sub-pixel emitters 110-120. The color conversion film 145-160 can be disposed on a subset of the plurality of blue-subpixel emitters 110, 120, 130, 140. The color conversion film 145-160 can be configured to convert blue light, from the subset of the plurality of blue sub-pixel emitters 110, 120, 130, 140, to red light.

The display component 100 can also include one or more additional conventional elements. For example, the display component 100 can further include a backplane 165, and an insulator region 170 disposed between the array of pixels 105-140 and the backplane 165. A plurality of anodes (not shown) can couple the plurality of pixels 105-140 to the backplane 165 through the insulator region 170. The display component 100 can further include a transparent cathode (not shown) over laying the plurality of pixels 105-140 and the color conversion film 145-160. The additional conventional elements are not necessary for an understanding of embodiments of the present technology, and therefore are not discussed in further detail herein.

In one implementation, the one or more green sub-pixel emitters and the plurality of blue sub-pixel emitters can be inorganic Micro Light Emitting Diodes (μLEDs). In another implementation, the one or more green sub-pixel emitters and the plurality of blue sub-pixel emitters can be Gallium Nitride (GaN) based Micro Light Emitting Diodes (μLEDs). In another implementation, the one or more green sub-pixel emitters and the plurality of blue sub-pixel emitters can be nanopyramid Light Emitting Diodes (LED). In another implementation, the one or more green sub-pixel emitters and the plurality of blue sub-pixel emitters can be Electroluminescent Light Emitting Diodes (EL-LED). In yet another implementation, the one or more green sub-pixel emitters and the plurality of blue sub-pixel emitters can be nanowire Light Emitting Diodes (LEDs). In one implementation, the one or more green sub-pixel emitters and the plurality of blue sub-pixel emitters can have a square shape, a rectangle shape, a hexagon shape, a diamond shape or any other similar shape. In one example, the blue and green sub-pixel emitters can have a size of approximately 3-10 micrometers (μm). In one example, the green sub-pixel emitters can have an efficacy of approximately greater than 40 lumens per Watt (lm/W), the blue sub-pixel emitters can have an efficacy of approximately greater than 5 lm/W, and the combination of the blue sub-pixel emitters with overlaying color conversion film can have an efficacy of approximately larger than 5 lm/W. These efficacy values can result in a power reduction of approximately 2-5 times compared to convention display components.

In one implementation, color conversion film can be a red quantum dot film. Quantum dots can be crystalline inorganic particles that are spherically shaped and have diameters of approximately 2-50 nanometer (nm). A quantum dots' optical properties (e.g., emission wavelength) are sensitive to the size of the particle, and therefore the optical properties can be tuned by controlling their size. The red quantum dot film can comprise an Indium Phosphide (InP) layer over coated with a Zinc Sulfide (ZnS) shell. The Indium Phosphide (InP) quantum dots over laid with Zinc Sulfide (ZnS) can be highly luminescent, can have stronger covalent bonds, and increased photostability as compared to Cadmium Sulfide (CdS).

Although embodiments are described and illustrated herein with reference a pixel including one green sub-pixel light source, three blue sub-pixel emitters, and a color conversion film over two of the blue sub-pixel emitters, it is appreciated that any number and arrangement of green and blue sub-pixel emitters along with the color conversion film over one or more of the blue sub-pixel emitters can be utilized to achieve a desired set of performance parameters, such as color gamut, brightness and the like. In other embodiments, the emitters may include different combinations of colors, and the color conversion film may be utilized to convert light from one or more colors of emitters to one or more other colors.

Figure 2:
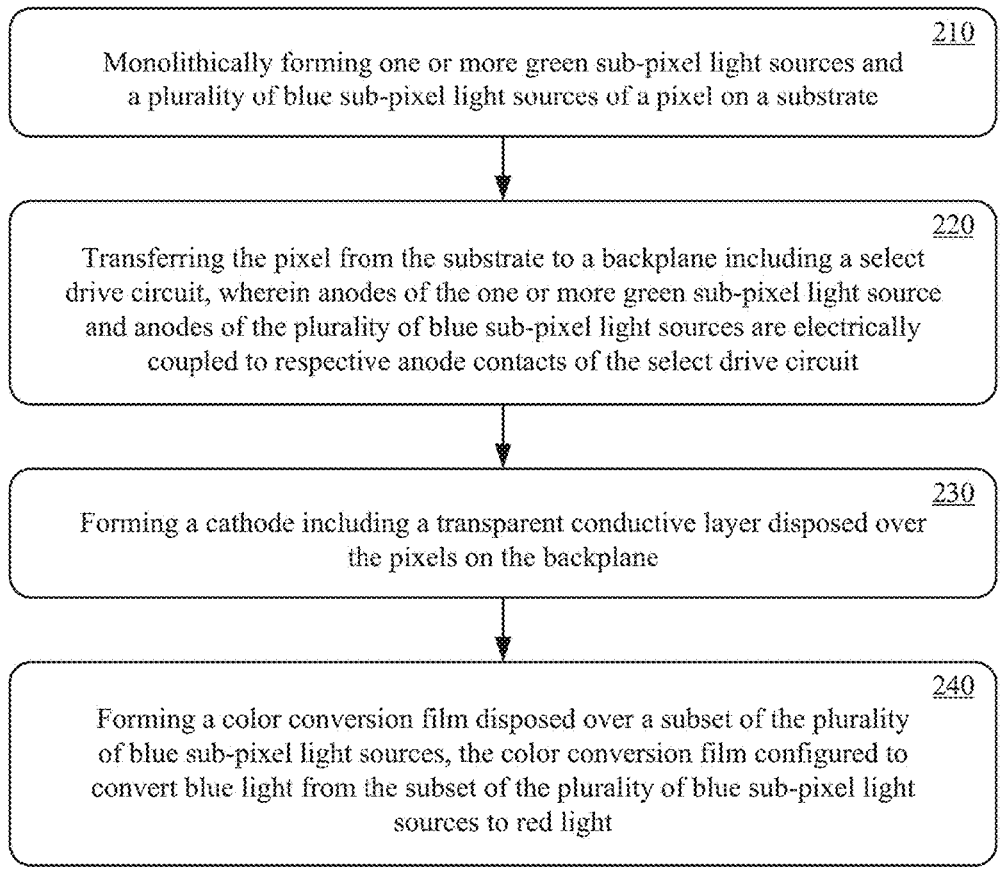
FIG. 2 is a flow diagram illustrating method of fabricating a display device, in accordance with an example embodiment.

FIG. 2 is a flow diagram illustrating method of fabricating a display device, in accordance with an example. In one aspect, one or more green sub-pixel emitters and a plurality of blue sub-pixel emitters of a pixel can be monolithically formed on a substrate 210. In one implementation, the monolithically fabricated green and blue sub-pixel emitters can be inorganic Micro Light Emitting Diodes (μLEDs). In another implementation, the monolithically fabricated green and blue sub-pixel emitters can be Gallium Nitride (GaN) based Micro Light Emitting Diodes (μLEDs). In another implementation, the monolithically fabricated green and blue sub-pixel emitters can be nanopyramid Light Emitting Diodes (LED). In another implementation, the monolithically fabricated green and blue sub-pixel emitters can be Electroluminescent Light Emitting Diodes (EL-LED). In yet another implementation, the monolithically fabricated green and blue sub-pixel emitters can be nanowire Light Emitting Diodes (LEDs).

In one implementation, the green and blue sub-pixels can be fabricated on a semiconductor substrate using conventional integrated circuit fabrication techniques. For example, a nanowire LED can be fabricated by forming the green and blue sub-pixels can include forming a nucleation layer on a wafer substrate. In one implementation, the wafer substrate can be a silicon wafer. A mask layer can be formed on the nucleation layer, wherein the mask layer includes a plurality of ring openings. An n-doped GaN core layer can be formed in rings disposed on the nucleation layer in the plurality ring openings of the mask layer. An active InGaN layer can be formed in rings disposed on the rings of the n-doped core layer. A p-doped cladding layer can be formed in rings disposed on the rings of the active layer. The rings of the n-doped layer, the active layer and the p-doped layer can have a coaxial core-shell cross section, a nanopyramid cross section, an axial nanowire cross section, or similar cross section. In one implementation, the wavelength of the one or more green sub-pixel emitters can be a function of one or more of a first cross section dimension of the rings of the active layer, a first diameter of the rings of the active layer, and a first concentration of Indium (In) of the active layer of an Indium Gallium Nitride/Gallium Nitride (InGaN/GaN) quantum well material. The wavelength of the plurality of blue sub-pixel emitters can be a function of one or more of a second cross section dimension of the rings of the active layer, a second diameter of the rings of the active layer, and a second concentration of Indium (In) of the active layer of an Indium Gallium Nitride/Gallium Nitride (InGaN/GaN) quantum well material.

Figure 3:
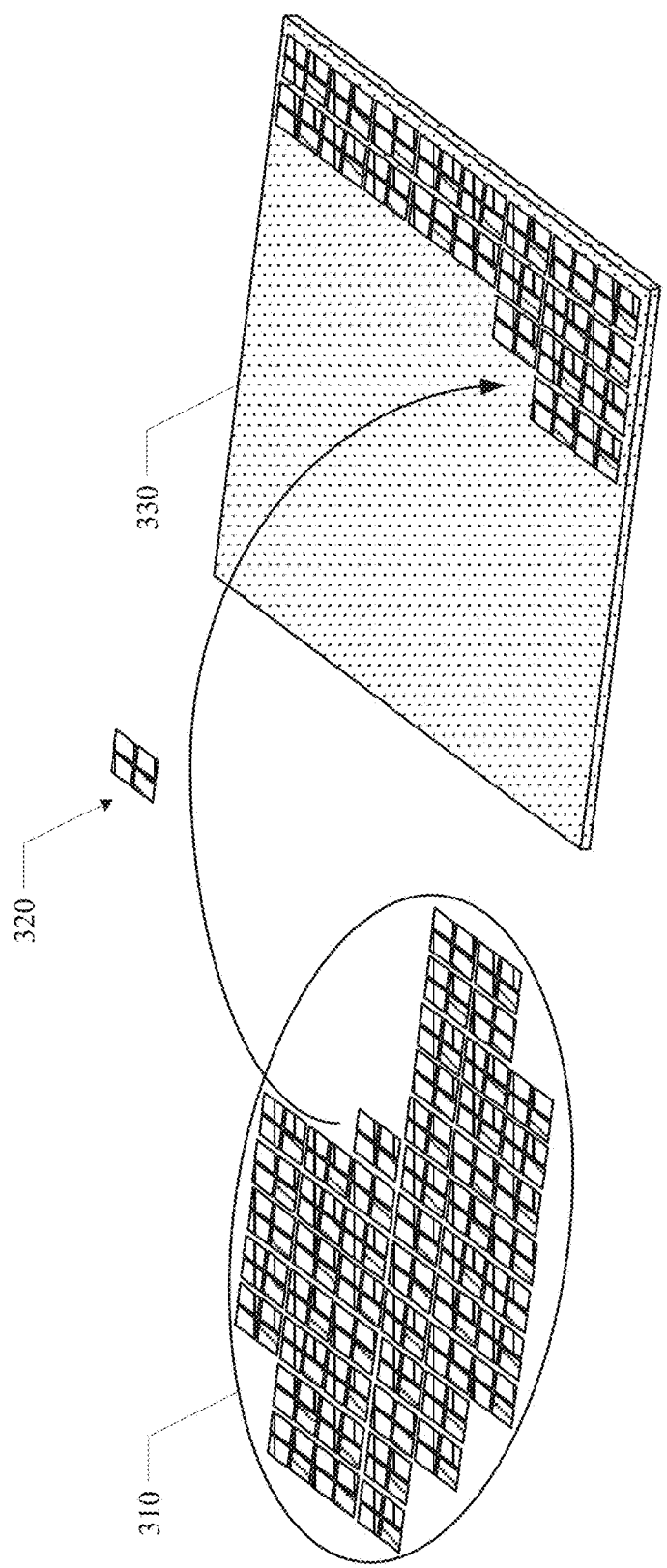
FIG. 3 is a diagram illustrating a transfer of a pixel from a substrate to a backplane, in accordance with an example embodiment.

In one aspect, the pixels can be transferred from the substrate to a backplane 220. Upon transfer of the pixels to the backplane, the anodes of the one or more green sub-pixel light source and anodes of the plurality of blue sub-pixel emitters can be electrically coupled to respective anode contacts of a select drive circuit in the backplane. In one implementation, as illustrated in FIG. 3, a plurality of pixels monolithically fabricated on a semiconductor wafer 310 can be singulated, that can then be picked 320 and placed on the backplane 330.

In one implementation, the transfer of the pixels can include aligning anodes of the one or more green sub-pixel emitters and anodes of the plurality of blue sub-pixel emitters of a first set of the plurality of pixels of the wafer with corresponding anodes of the select drive circuits of a first backplane. The anodes of the one or more green sub-pixel emitters and the anodes of the plurality of blue sub-pixel emitters of the first set of the plurality of pixels of the wafer can be thermocompression bonded to the corresponding anodes of the select drive circuits of the first backplane. The one or more green sub-pixel emitters and the plurality of blue sub-pixel emitters of the first set of one of the plurality of pixels can then be de-bonded from the wafer. The transfer can further include aligning anodes of the one or more green sub-pixel light source and anodes of the plurality of blue sub-pixel emitters of a second set of the plurality of pixels of the wafer with corresponding anodes of the select drive circuits of a second backplane, wherein the second set of the plurality of pixels are offset by a predetermined pitch from the first set of the plurality of pixels of the wafer. The anodes of the one or more green sub-pixel emitters and the anodes of the plurality of blue sub-pixel emitters of the second set of the plurality of pixels of the wafer can the thermocompression bonded with the corresponding anodes of the select drive circuits of the second backplane. The one or more green sub-pixel emitters and the plurality of blue sub-pixel emitters of the second set of the plurality of pixels can then be de-bonded from the wafer. One or more bumps on the second backplane can provide support between the wafer and the second backplane during the thermocompression bonding and the de-bonding.

Referring again to FIG. 2, in one aspect, a cathode including a transparent conductive layer can be formed over the pixels on the backplane 230. In one aspect, a color conversion film can be formed over a subset of the plurality of blue sub-pixel emitters 240. The color conversion film can be configured to convert blue light from the subset of the plurality of blue sub-pixel emitters to red light. In one implementation, forming the color conversion film can include depositing a color conversion layer on the cathode including the transparent conductive layer. A masking layer can be deposited and patterned on the color conversion layer, wherein the patterned masking layer is disposed over the subset of the plurality of blue sub-pixel emitters. The color conversion layer exposed by the patterned masking layer can then be selectively removed to form the color conversion film disposed over a subset of the plurality of blue sub-pixel emitters. In another implementation, forming the color conversion film can include depositing and patterning a masking layer on the cathode including the transparent conductive layer, wherein openings in the patterned masking layer are disposed over the subset of the plurality of blue sub-pixel emitters. A color conversion layer can then be deposited in the opening in the patterned masking layer to form the color conversion film disposed over a subset of the plurality of blue sub-pixel emitters.

Monolithic manufacturing of high-efficiency green and blue Photoluminescent Light Emitting Diodes (PL-LED), Electroluminescent Light Emitting Diodes (EL-LED), inorganic Micro Light Emitting Diodes (μLEDs), Gallium Nitride (GaN) based Micro Light Emitting Diodes (μLEDs), nanowire Light Emitting Diodes (LEDs), and similar emitters has been demonstrated. However, it has been challenging to obtain high efficiency red emitters using the same technologies. Therefore, the color conversion film in combination with a subset of the plurality of blue sub-pixel emitters can be utilized to achieve a high-efficiency red light source. Although it may be possible to utilize other technologies to fabricate a high-efficiency red light source, the separate fabrication of red sub-pixel emitters, and pick and placing of the separate emitters on a backplane to manufacture the display component is relatively complex. In contrast, a monolithically fabricated pixel including one or more green sub-pixel emitters and a plurality of blue sub-pixel emitters, along with the color conversion film, reduces the manufacturing complexity of the display component.

Figure 4:
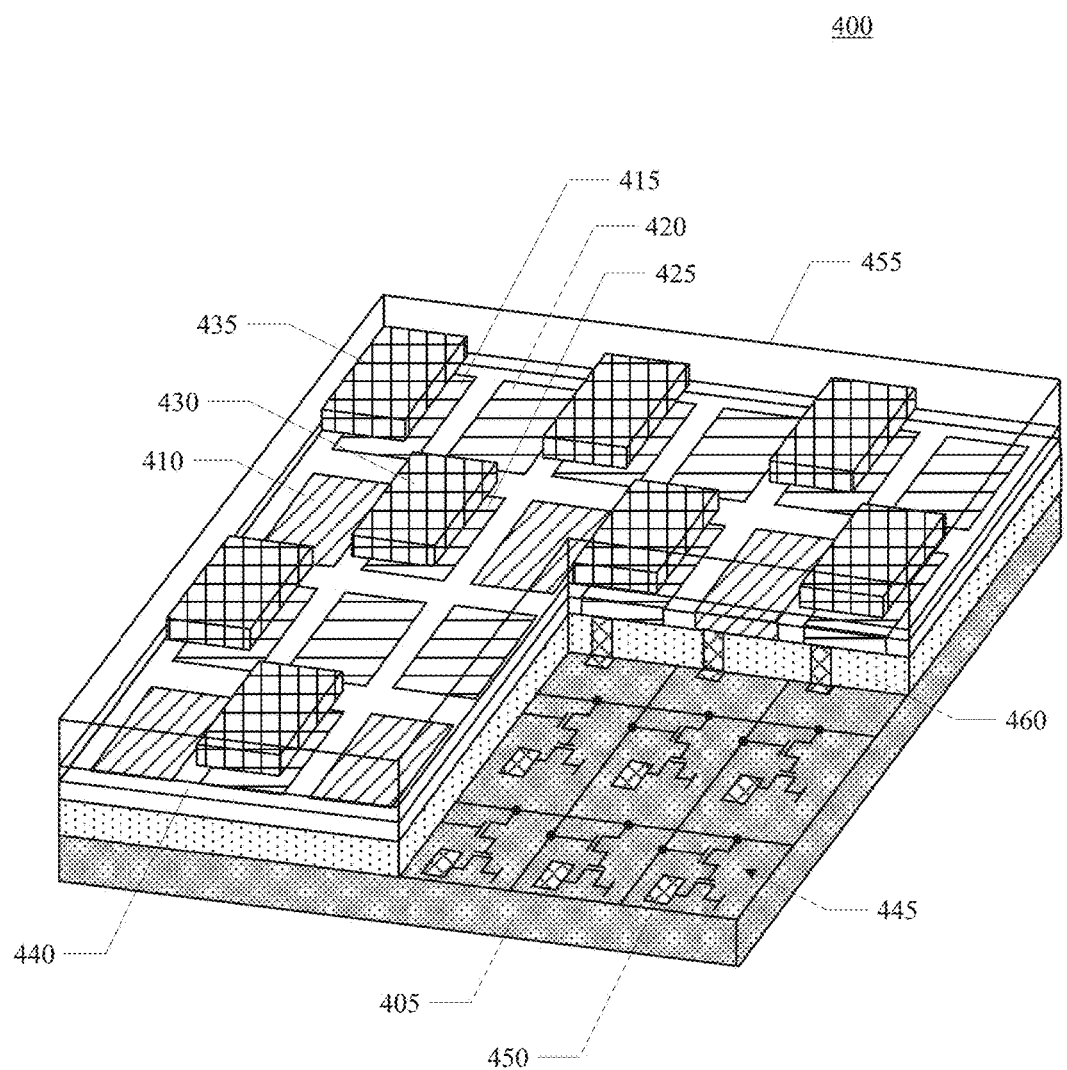
FIG. 4 is a diagram illustrating a display device, in accordance with an example embodiment.

FIG. 4 is a diagram illustrating a display device, in accordance with an example. In one aspect, the display 400 can include a backplane 405, an array of pixels 410-425, a color conversion film 430, 435, and a cathode 440. The backplane 405 can include a select drive circuit 445 including an array of anodes 450. The array of pixels 410-425 can include one or more green sub-pixel emitters 410 coupled to respective one or more anodes 435 of the backplane 405, and a plurality of blue sub-pixel emitters 415-425 coupled to respective ones of a plurality of the anodes 435 of the backplane 405. The color conversion film 430, 435 can be disposed on a subset of the plurality of blue sub-pixel emitters 415, 425. The color conversion film can be configured to convert blue light from the subset of the plurality of blue sub-pixel emitters 415, 425 to red light. The cathode 440 can include a transparent conductive layer disposed over the one or more green sub-pixel emitters 410 and the plurality of blue sub-pixel emitters 415-425, and disposed under the color conversion film 430-435. In one implementation, the cathode 440 can comprise an Indium Tin Oxide (ITO) layer. The display 400 can also include a transparent protection barrier layer 455 disposed over the array of pixels 410-425 and the color conversion film 430, 435. In one implementation, the transparent protection barrier layer 455 can comprise a Silicon Oxide layer. The display 400 can also include an insulator layer 460 disposed between the array of pixels 410-425 and the backplane 405. An insulator can also be disposed between the sub-pixel emitters of the array of pixels 410-425.

In one implementation, the one or more green sub-pixel emitters and the plurality of blue sub-pixel emitters can be nanopyramid Light Emitting Diodes (LED). In another implementation, the one or more green sub-pixel emitters and the plurality of blue sub-pixel emitters can be Electroluminescent Light Emitting Diodes (EL-LED). In another implementation, the one or more green sub-pixel emitters and the plurality of blue sub-pixel emitters can be inorganic Micro Light Emitting Diodes (µLEDs). In another implementation, the one or more green sub-pixel emitters and the plurality of blue sub-pixel emitters can be Gallium Nitride (GaN) based Micro Light Emitting Diodes (µLEDs). In yet another implementation, the one or more green sub-pixel emitters and the plurality of blue sub-pixel emitters can be nanowire Light Emitting Diodes (LEDs). The nanowire LEDs can include a substrate, a nucleation layer disposed on the substrate, a mask layer partially disposed on the nucleation layer, an n-doped core layer disposed on the nucleation layer in opening in the mask layer, an active layer disposed on the n-doped core layer, and a p-doped cladding layer disposed on the active layer.

In one implementation, the color conversion film can be a red quantum dot film. In one implementation, the red quantum dot film can comprise an Indium Phosphide (InP) layer over coated with a Zinc Sulfide (ZnS) shell. The quantum dots can have a spherical shape of approximately 2-50 nm in diameter.

Figure 5:
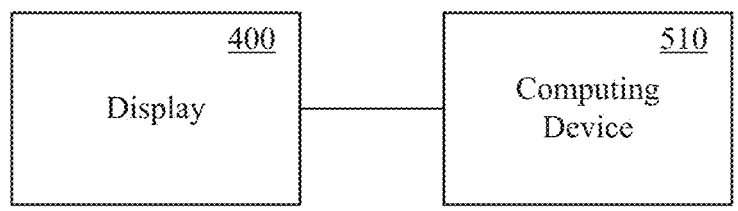
FIG. 5 is a diagram illustrating a system including a display in accordance with an example embodiment.

FIG. 5 is a diagram illustrating a system (e.g. a display system, computing system, etc.) including a display, in accordance with an example. The system 500 can include a computing device 510 and a display device 400. The display device 400 can include a backplane 405, an array of pixels 410-425, a color conversion film 430, 435, and a cathode 440 as described above with reference to FIG. 4. The computing device 510 can provide content for output on the display device 400. The computing device 410 can be a smart phone, a smart watch, a Head Mounted Display (HMD), a tablet Personal Computer (PC), a laptop PC, a desktop PC, a television, a personal gaming unit or other similar device.

The color conversion film in combination with a subset of the plurality of blue sub-pixel emitters can be advantageously utilized to achieve a high-efficiency red light source. In addition, the monolithically fabricated pixel including one or more green sub-pixel emitters and a plurality of blue sub-pixel emitters, along with the color conversion film, can advantageously reduce the manufacturing complexity of the display component.

EXAMPLES

The following examples pertain to specific technology embodiments and point out specific features, elements, or steps that may be used or otherwise combined in achieving such embodiments.

In one example there is provided a display component comprising: an array of pixels, each pixel including; one or more green sub-pixel emitters; a plurality of blue sub-pixel emitters; and a color conversion film disposed on a subset of the plurality of blue sub-pixel emitters, the color conversion film configured to convert blue light from the subset of the plurality of blue sub-pixel emitters to red light.

In one example of a display component, the one or more green sub-pixel emitters and the plurality of blue sub-pixel emitters comprise a plurality of inorganic Micro Light Emitting Diodes (µLEDs).

In one example of a display component, the one or more green sub-pixel emitters and the plurality of blue sub-pixel emitters comprise a plurality of Gallium Nitride (GaN) based Micro Light Emitting Diodes (µLEDs).

In one example of a display component, the one or more green sub-pixel emitters and the plurality of blue sub-pixel emitters comprise nanopyramid Light Emitting Diodes (LED).

In one example of a display component, the one or more green sub-pixel emitters and the plurality of blue sub-pixel emitters comprise Electroluminescent Light Emitting Diodes (EL-LED).

In one example of a display component, the one or more green sub-pixel emitters and the plurality of blue sub-pixel emitters comprises nanowire Light Emitting Diodes (LEDs).

In one example of a display component, the nanowire LEDs comprise: a substrate; a nucleation layer disposed on the substrate; a mask layer partially disposed on the nucleation layer; an n-doped core layer disposed on the nucleation layer in opening in the mask layer; an active layer disposed on the n-doped core layer; and a p-doped cladding layer disposed on the active layer.

In one example of a display component, the one or more green sub-pixel emitters and the plurality of blue sub-pixel emitters have a shape selected from a group consisting of a square, a rectangle, a hexagon, and a diamond.

In one example of a display component, the color conversion film comprises a red quantum dot film.

In one example of a display component, the red quantum dot film comprises an Indium Phosphide (InP) based quantum dot.

In one example of a display component, the one or more green sub-pixel emitter and the plurality of blue sub-pixel emitters are approximately 3-10 micrometers (μm).

In one example of a display component, the one or more green sub-pixel emitter and the plurality of blue sub-pixel emitters are approximately 4 micrometers (μm).

In one example of a display component, the one or more green sub-pixel emitters have an efficiency of approximately 40 lumens per Watt (lm/W) or greater; the plurality of blue sub-pixel emitters have an efficiency of approximately 5 lm/W or greater; and the subset of the plurality of blue sub-pixel emitters overlaid with the color conversion film have an efficiency of approximately 5 lm/W or greater.

In one example of a display component, each pixel includes: one green sub-pixel emitter; and three blue sub-pixel emitters, wherein two blue sub-pixel emitters are overlaid with the color conversion film.

In one example of a display component, each pixel includes: one green sub-pixel emitter; and three blue sub-pixel emitters, wherein two blue sub-pixel emitters are overlaid with the color conversion film.

In one example of a display component, each pixel includes: one green sub-pixel emitter; and three blue sub-pixel emitters, wherein one blue sub-pixel emitter is overlaid with the color conversion film.

In one example of a display component, each pixel includes: two green sub-pixel emitter; and two blue sub-pixel emitters, wherein one blue sub-pixel emitter is overlaid with the color conversion film.

In one example of a display component, each pixel comprises a monolithic structure of the one or more green sub-pixel emitters and the plurality of blue sub-pixel emitters.

In one example of a display component, the monolithic structure is mounted on a silicon substrate.

In one example there is provided a display device comprising: a backplane including a select drive circuit including an array of anodes; an array of pixels including; one or more green sub-pixel emitters coupled to respective one or more anodes of the backplane; and a plurality of blue sub-pixel emitters coupled to respective ones of a plurality of the anodes of the backplane; a color conversion film disposed on a subset of the plurality of blue sub-pixel emitters, the color conversion film configured to convert blue light from the subset of the plurality of blue sub-pixel emitters to red light; and a cathode including a transparent conductive layer disposed over the one or more green sub-pixel emitters and the plurality of blue sub-pixel emitters, and disposed under the color conversion film.

In one example of a display device, the device further comprises a protection barrier layer disposed on the array of pixels and color conversion film.

In one example of a display device, the one or more green sub-pixel emitters and the plurality of blue sub-pixel emitters comprise nanopyramid Light Emitting Diodes (LED).

In one example of a display device, the one or more green sub-pixel emitters and the plurality of blue sub-pixel emitters comprise Electroluminescent Light Emitting Diodes (EL-LED).

In one example of a display device, the one or more green sub-pixel emitters and the plurality of blue sub-pixel emitters comprise inorganic Micro Light Emitting Diodes (μLEDs).

In one example of a display device, the one or more green sub-pixel emitters and the plurality of blue sub-pixel emitters comprise Gallium Nitride (GaN) based Micro Light Emitting Diodes (μLEDs).

In one example of a display device, the one or more green sub-pixel emitters and the plurality of blue sub-pixel emitters comprise nanowire Light Emitting Diodes (LEDs).

In one example of a display device, the nanowire LEDs comprise: a substrate; a nucleation layer disposed on the substrate; a mask layer partially disposed on the nucleation layer; an n-doped core layer disposed on the nucleation layer in opening in the mask layer; an active layer disposed on the n-doped core layer; and a p-doped cladding layer disposed on the active layer.

In one example of a display device, the color conversion film comprises a red quantum dot film.

In one example of a display device, the red quantum dot film comprises an Indium Phosphide (InP) layer over coated with a Zinc Sulfide (ZnS) shell.

In one example of a display device, each pixel comprises a monolithic structure of the one or more green sub-pixel emitters and the plurality of blue sub-pixel emitters.

In one example of a display device, each pixel comprises a monolithic structure of the one or more green sub-pixel emitters and the plurality of blue sub-pixel emitters on a silicon substrate.

In one example of a display device, the one or more green sub-pixel emitter and the plurality of blue sub-pixel emitters are approximately 3-10 micrometers (μm).

In one example of a display device, the one or more green sub-pixel emitter and the plurality of blue sub-pixel emitters are approximately 4 micrometers (μm).

In one example of a display device, the one or more green sub-pixel emitters have an efficiency of approximately 40 lumens per Watt (lm/W) or greater; the plurality of blue sub-pixel emitters have an efficiency of approximately 5 lm/W or greater; and the subset of the plurality of blue sub-pixel emitters overlaid with the color conversion film have an efficiency of approximately 5 lm/W or greater.

In one example of a display device, each pixel includes: one green sub-pixel emitter; and three blue sub-pixel emitters, wherein two blue sub-pixel emitters are overlaid with the color conversion film.

In one example of a display device, each pixel includes: one green sub-pixel emitter; and three blue sub-pixel emitters, wherein two blue sub-pixel emitters are overlaid with the color conversion film.

In one example of a display device, each pixel includes: one green sub-pixel emitter; and three blue sub-pixel emitters, wherein one blue sub-pixel emitter is overlaid with the color conversion film.

In one example of a display device, each pixel includes: two green sub-pixel emitter; and two blue sub-pixel emitters, wherein one blue sub-pixel emitter is overlaid with the color conversion film.

In one example of a display device, the device is a component included in a smart phone, a smart watch, a Head Mounted Display (HMD), a tablet Personal Computer (PC), a laptop PC, a desktop PC, a television, or a personal gaming unit.

In one example, there is provided a display system comprising: a display device as recited herein; and a computing device communicatively coupled thereto.

In one example of a display system, the computing system provides content for output on the display device.

In one example, there is provided a method of fabricating a display device comprising: monolithically forming one or more green sub-pixel emitters and a plurality of blue sub-pixel emitters of a pixel on a substrate; transferring the pixel from the substrate to a backplane including a select drive circuit, wherein anodes of the one or more green sub-pixel light source and anodes of the plurality of blue sub-pixel emitters are electrically coupled to respective anode contacts of the select drive circuit; forming a cathode including a transparent conductive layer disposed over the pixels on the backplane; and forming a color conversion film disposed over a subset of the plurality of blue sub-pixel emitters, the color conversion film configured to convert blue light from the subset of the plurality of blue sub-pixel emitters to red light.

In one example of a method of fabricating a display device, monolithically forming one or more green sub-pixel emitters and the plurality of blue sub-pixel emitters of the pixel on the substrate comprises: forming a nucleation layer on a substrate; forming a mask layer on the nucleation layer, the mask layer including a plurality of ring openings; forming an n-doped core layer in rings disposed on the nucleation layer in the plurality of ring openings of the mask layer; forming an active layer in rings disposed on the rings of n-doped core layer; and forming a p-doped cladding layer in rings disposed on the rings of the active layer.

In one example of a method of fabricating a display device, a wavelength of the one or more green sub-pixel emitters is a function of one or more of a first cross section dimension of the rings of the active layer, a first diameter of the rings of the active layer, and a first concentration of Indium (In) of the active layer of an Indium Gallium Nitride/Gallium Nitride (InGaN/GaN) quantum well material; and a wavelength of the plurality of blue sub-pixel emitters is a function of one or more of a second cross section dimension of the rings of the active layer, a second diameter of the rings of the active layer, and a second concentration of Indium (In) of the active layer of an Indium Gallium Nitride/Gallium Nitride (InGaN/GaN) quantum well material.

In one example of a method of fabricating a display device, the rings of the n-doped layer, the active layer and the p-doped layer include one of a coaxial core-shell cross section, a nanopyramid cross section, and an axial nanowire cross section.

In one example of a method of fabricating a display device, transferring the pixel from the substrate to the backplane comprises: aligning anodes of the one or more green sub-pixel emitters and anodes of the plurality of blue sub-pixel emitters of a first set of the plurality of pixels of the wafer with corresponding anodes of the select drive circuits of a first backplane; thermocompression bonding the anodes of the one or more green sub-pixel emitters and the anodes of the plurality of blue sub-pixel emitters of the first set of the plurality of pixels of the wafer with the corresponding anodes of the select drive circuits of the first backplane; and de-bonding the one or more green sub-pixel emitters and the plurality of blue sub-pixel emitters of the first set of one of the plurality of pixels from the wafer.

Example 48 include the display component of Example 47, wherein transferring the pixel from the substrate to the backplane further comprises: aligning anodes of the one or more green sub-pixel light source and anodes of the plurality of blue sub-pixel emitters of a second set of the plurality of pixels of the wafer with corresponding anodes of the select drive circuits of a second backplane, wherein the second set of the plurality of pixels are offset by a predetermined pitch from the first set of the plurality of pixels of the wafer; thermocompression bonding the anodes of the one or more green sub-pixel emitters and the anodes of the plurality of blue sub-pixel emitters of the second set of the plurality of pixels of the wafer with the corresponding anodes of the select drive circuits of the second backplane; and de-bonding the one or more green sub-pixel emitters and the plurality of blue sub-pixel emitters of the second set of the plurality of pixels from the wafer.

In one example of a method of fabricating a display device, one or more bumps on the second backplane provide support between the wafer and the second backplane during the thermocompression bonding and the de-bonding.

In one example of a method of fabricating a display device, forming the color conversion film disposed over the subset of the plurality of blue sub-pixel emitters comprises: depositing a color conversion layer on the cathode including the transparent conductive layer; depositing and patterning a masking layer on the color conversion layer, wherein the patterned masking layer is disposed over the subset of the plurality of blue sub-pixel emitters; and selectively removing the color conversion layer exposed by the patterned masking layer to form the color conversion film disposed over a subset of the plurality of blue sub-pixel emitters.

In one example of a method of fabricating a display device, forming the color conversion film disposed over the subset of the plurality of blue sub-pixel emitters comprises: depositing and patterning a masking layer on the cathode including the transparent conductive layer, wherein openings in the patterned masking layer are disposed over the subset of the plurality of blue sub-pixel emitters; depositing a color conversion layer in the opening in the patterned masking layer to form the color conversion film disposed over a subset of the plurality of blue sub-pixel emitters.

In one example of a method of fabricating a display device, the one or more green sub-pixel emitters and the plurality of blue sub-pixel emitters comprise a plurality of inorganic Micro Light Emitting Diodes (µLEDs).

In one example of a method of fabricating a display device, the one or more green sub-pixel emitters and the plurality of blue sub-pixel emitters comprise a plurality of Gallium Nitride (GaN) based Micro Light Emitting Diodes (µLEDs).

In one example of a method of fabricating a display device, the one or more green sub-pixel emitters and the plurality of blue sub-pixel emitters comprise nanopyramid Light Emitting Diodes (LED).

In one example of a method of fabricating a display device, the one or more green sub-pixel emitters and the plurality of blue sub-pixel emitters comprise Electroluminescent Light Emitting Diodes (EL-LED).

In one example of a method of fabricating a display device, the one or more green sub-pixel emitters and the plurality of blue sub-pixel emitters comprises nanowire Light Emitting Diodes (LEDs).

In one example of a method of fabricating a display device, monolithically forming one or more green sub-pixel emitters and a plurality of blue sub-pixel emitters of a pixel on the substrate comprises monolithically forming one or more green sub-pixel emitters and a plurality of blue sub-pixel emitters of a pixel on a silicon wafer.

In one example of a method of fabricating a display device, the one or more green sub-pixel emitter and the plurality of blue sub-pixel emitters are approximately 3-10 micrometers (µm).

In one example of a method of fabricating a display device, the one or more green sub-pixel emitter and the plurality of blue sub-pixel emitters are approximately 4 micrometers (µm).

In one example of a method of fabricating a display device, the one or more green sub-pixel emitters have an efficiency of approximately 40 lumens per Watt (lm/W) or greater; the plurality of blue sub-pixel emitters have an efficiency of approximately 5 lm/W or greater; and the subset of the plurality of blue sub-pixel emitters overlaid with the color conversion film have an efficiency of approximately 5 lm/W or greater.

In one example of a method of fabricating a display device, each pixel includes: one green sub-pixel emitter; and three blue sub-pixel emitters, wherein two blue sub-pixel emitters are overlaid with the color conversion film.

In one example of a method of fabricating a display device, each pixel includes: one green sub-pixel emitter; and three blue sub-pixel emitters, wherein two blue sub-pixel emitters are overlaid with the color conversion film.

In one example of a method of fabricating a display device, each pixel includes: one green sub-pixel emitter; and three blue sub-pixel emitters, wherein one blue sub-pixel emitter is overlaid with the color conversion film.

In one example of a method of fabricating a display device, each pixel includes: two green sub-pixel emitter; and two blue sub-pixel emitters, wherein one blue sub-pixel emitter is overlaid with the color conversion film.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A display component comprising:
   an array of pixels, each pixel including;
      one or more green sub-pixel emitters;
      a plurality of blue sub-pixel emitters; and
      a color conversion film disposed on a subset of the plurality of blue sub-pixel emitters, the color conversion film configured to convert blue light from the subset of the plurality of blue sub-pixel emitters to red light.

2. The display component of claim 1, wherein the one or more green sub-pixel emitters and the plurality of blue sub-pixel emitters comprise a plurality of inorganic Micro Light Emitting Diodes (µLEDs).

3. The display component of claim 1, wherein the one or more green sub-pixel emitters and the plurality of blue sub-pixel emitters comprise a plurality of Gallium Nitride (GaN) based Micro Light Emitting Diodes (µLEDs).

4. The display component of claim 1, wherein the one or more green sub-pixel emitters and the plurality of blue sub-pixel emitters comprise nanopyramid Light Emitting Diodes (LED).

5. The display component of claim 1, wherein the one or more green sub-pixel emitters and the plurality of blue sub-pixel emitters comprise Electroluminescent Light Emitting Diodes (EL-LED).

6. The display component of claim 1, wherein the one or more green sub-pixel emitters and the plurality of blue sub-pixel emitters comprises nanowire Light Emitting Diodes (LEDs).

7. The display component of claim 1, wherein the one or more green sub-pixel emitters and the plurality of blue sub-pixel emitters have a shape selected from a group consisting of a square, a rectangle, a hexagon, and a diamond.

8. The display component of claim 1, wherein the color conversion film comprises a red quantum dot film.

9. The display component of claim 1, wherein the one or more green sub-pixel emitter and the plurality of blue sub-pixel emitters are approximately 3-10 micrometers (µm).

10. The display component of claim 1, wherein the one or more green sub-pixel emitter and the plurality of blue sub-pixel emitters are approximately 4 micrometers (µm).

11. The display component of claim 1, wherein,
   the one or more green sub-pixel emitters have an efficiency of approximately 40 lumens per Watt (lm/W) or greater;
   the plurality of blue sub-pixel emitters have an efficiency of approximately 5 lm/W or greater; and
   the subset of the plurality of blue sub-pixel emitters overlaid with the color conversion film have an efficiency of approximately 5 lm/W or greater.

12. The display component of claim 1, wherein each pixel includes:
   one green sub-pixel emitter; and
   three blue sub-pixel emitters, wherein two blue sub-pixel emitters are overlaid with the color conversion film.

13. The display component of claim 1, wherein each pixel includes:
   one green sub-pixel emitter; and
   three blue sub-pixel emitters, wherein two blue sub-pixel emitters are overlaid with the color conversion film.

14. The display component of claim 1, wherein each pixel includes:
   one green sub-pixel emitter; and
   three blue sub-pixel emitters, wherein one blue sub-pixel emitter is overlaid with the color conversion film.

15. The display component of claim 1, wherein each pixel includes:
   two green sub-pixel emitter; and
   two blue sub-pixel emitters, wherein one blue sub-pixel emitter is overlaid with the color conversion film.

16. The display component of claim 1, wherein each pixel comprises a monolithic structure of the one or more green sub-pixel emitters and the plurality of blue sub-pixel emitters.

17. A display device comprising:
   a backplane including a select drive circuit including an array of anodes;
   an array of pixels including;
      one or more green sub-pixel emitters coupled to respective one or more anodes of the backplane; and
      a plurality of blue sub-pixel emitters coupled to respective ones of a plurality of the anodes of the backplane;
   a color conversion film disposed on a subset of the plurality of blue sub-pixel emitters, the color conversion film configured to convert blue light from the subset of the plurality of blue sub-pixel emitters to red light; and
   a cathode including a transparent conductive layer disposed over the one or more green sub-pixel emitters and the plurality of blue sub-pixel emitters, and disposed under the color conversion film.

18. The display device of claim 17, further comprising a protection barrier layer disposed on the array of pixels and color conversion film.

19. The display device of claim 17, wherein the one or more green sub-pixel emitters and the plurality of blue sub-pixel emitters comprise nanowire Light Emitting Diodes (LEDs).

20. The display device of claim 19, wherein the nanowire LEDs comprise:
a substrate;
a nucleation layer disposed on the substrate;
a mask layer partially disposed on the nucleation layer;
an n-doped core layer disposed on the nucleation layer in opening in the mask layer;
an active layer disposed on the n-doped core layer; and
a p-doped cladding layer disposed on the active layer.

21. The display device of claim 17, wherein the color conversion film comprises a red quantum dot film.

22. A method of fabricating a display device comprising:
monolithically forming one or more green sub-pixel emitters and a plurality of blue sub-pixel emitters of a pixel on a substrate;
transferring the pixel from the substrate to a backplane including a select drive circuit, wherein anodes of the one or more green sub-pixel light source and anodes of the plurality of blue sub-pixel emitters are electrically coupled to respective anode contacts of the select drive circuit;
forming a cathode including a transparent conductive layer disposed over the pixels on the backplane; and
forming a color conversion film disposed over a subset of the plurality of blue sub-pixel emitters, the color conversion film configured to convert blue light from the subset of the plurality of blue sub-pixel emitters to red light.

23. The method of fabricating a display device according to claim 22, wherein monolithically forming one or more green sub-pixel emitters and the plurality of blue sub-pixel emitters of the pixel on the substrate comprises:
forming a nucleation layer on the substrate;
forming a mask layer on the nucleation layer, the mask layer including a plurality of ring openings;
forming an n-doped core layer in rings disposed on the nucleation layer in the plurality of ring openings of the mask layer;
forming an active layer in rings disposed on the rings of n-doped core layer; and
forming a p-doped cladding layer in rings disposed on the rings of the active layer.

24. The method of fabricating a display device according to claim 23, wherein,
a wavelength of the one or more green sub-pixel emitters is a function of one or more of a first cross section dimension of the rings of the active layer, a first diameter of the rings of the active layer, and a first concentration of Indium (In) of the active layer of an Indium Gallium Nitride/Gallium Nitride (InGaN/GaN) quantum well material; and
a wavelength of the plurality of blue sub-pixel emitters is a function of one or more of a second cross section dimension of the rings of the active layer, a second diameter of the rings of the active layer, and a second concentration of Indium (In) of the active layer of an Indium Gallium Nitride/Gallium Nitride (InGaN/GaN) quantum well material.

25. The method of fabricating a display device according to claim 23, wherein the rings of the n-doped layer, the active layer and the p-doped layer include one of a coaxial core-shell cross section, a nanopyramid cross section, and an axial nanowire cross section.

26. The method of fabricating a display device according to claim 22, wherein transferring the pixel from the substrate to the backplane comprises:
aligning anodes of the one or more green sub-pixel emitters and anodes of the plurality of blue sub-pixel emitters of a first set of the plurality of pixels of the wafer with corresponding anodes of the select drive circuits of a first backplane;
thermocompression bonding the anodes of the one or more green sub-pixel emitters and the anodes of the plurality of blue sub-pixel emitters of the first set of the plurality of pixels of the wafer with the corresponding anodes of the select drive circuits of the first backplane; and
de-bonding the one or more green sub-pixel emitters and the plurality of blue sub-pixel emitters of the first set of one of the plurality of pixels from the wafer.

27. The method of fabricating a display device according to claim 26, wherein transferring the pixel from the substrate to the backplane further comprises:
aligning anodes of the one or more green sub-pixel light source and anodes of the plurality of blue sub-pixel emitters of a second set of the plurality of pixels of the wafer with corresponding anodes of the select drive circuits of a second backplane, wherein the second set of the plurality of pixels are offset by a predetermined pitch from the first set of the plurality of pixels of the wafer;
thermocompression bonding the anodes of the one or more green sub-pixel emitters and the anodes of the plurality of blue sub-pixel emitters of the second set of the plurality of pixels of the wafer with the corresponding anodes of the select drive circuits of the second backplane; and
de-bonding the one or more green sub-pixel emitters and the plurality of blue sub-pixel emitters of the second set of the plurality of pixels from the wafer.

28. The method of fabricating a display device according to claim 27, wherein one or more bumps on the second backplane provide support between the wafer and the second backplane during the thermocompression bonding and the de-bonding.

* * * * *